United States Patent
Zhu et al.

(10) Patent No.: US 10,910,462 B2
(45) Date of Patent: Feb. 2, 2021

(54) DISPLAY SUBSTRATE FOR AVOIDING LIGHT LEAKAGE DEFECT, METHOD FOR MANUFACTURING THE SAME AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Sheng Zhu, Beijing (CN); Zhengyuan Zhang, Beijing (CN); Peng Sui, Beijing (CN); Can Yuan, Beijing (CN); Haitao Gong, Beijing (CN); Qingqiao Jia, Beijing (CN); Fei Liu, Beijing (CN); Xi Chen, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/576,812

(22) Filed: Sep. 20, 2019

(65) Prior Publication Data
US 2020/0098845 A1    Mar. 26, 2020

(30) Foreign Application Priority Data
Sep. 25, 2018 (CN) .......................... 2018 1 1114424

(51) Int. Cl.
*H01L 27/32* (2006.01)
*H01L 51/56* (2006.01)

(52) U.S. Cl.
CPC ...... *H01L 27/3276* (2013.01); *H01L 27/3246* (2013.01); *H01L 51/56* (2013.01); *H01L 2227/323* (2013.01)

(58) Field of Classification Search
CPC . H01L 27/3276; H01L 51/56; H01L 27/3246; H01L 2227/323; H01L 27/32
(Continued)

(56) References Cited

U.S. PATENT DOCUMENTS 9,461,100 B2 * 10/2016 Sato .................... H01L 27/3246
2003/0071931 A1 * 4/2003 Nakayoshi ........ G02F 1/136213
349/39
(Continued)

FOREIGN PATENT DOCUMENTS

CN        1400676 A     3/2003
CN     103348477 A    10/2013
(Continued)

OTHER PUBLICATIONS

First Office Action dated Feb. 3, 2020 corresponding to Chinese application No. 201811114424.5.

*Primary Examiner* — Alexander O Williams
(74) *Attorney, Agent, or Firm* — Nath, Goldberg & Meyer; Joshua B. Goldberg

(57) ABSTRACT

A display substrate, a method for manufacturing the same and a display device are provided. The display substrate includes a base substrate, first electrodes above the base substrate, and a light emitting layer disposed at a side of the first electrodes distal from the base substrate, the display substrate further includes signal lines extending in a first direction and fuse wires extending in a second direction, each fuse wire has a fusing point higher than that of the light emitting layer, the fuse wires are located at a side of the light emitting layer proximal to the base substrate and in contact with the light emitting layer, each fuse wire is electrically coupled to at least two signal lines, and an orthographic projection of at least one first electrode on the base substrate
(Continued)

is located between orthographic projections of the at least two signal lines on the base substrate.

20 Claims, 3 Drawing Sheets

(58) Field of Classification Search
USPC .......................................................... 257/40
See application file for complete search history.

(56) References Cited

U.S. PATENT DOCUMENTS

2016/0118449 A1    4/2016  Sato et al.
2016/0268356 A1*   9/2016  Go ..................... H01L 27/3248

FOREIGN PATENT DOCUMENTS

| CN | 107346778 A  | 11/2017 |
| CN | 108269830 A  | 7/2018  |
| CN | 108649057 A  | 10/2018 |
| WO | 2017158477 A1| 9/2017  |

* cited by examiner

DISPLAY SUBSTRATE FOR AVOIDING LIGHT LEAKAGE DEFECT, METHOD FOR MANUFACTURING THE SAME AND DISPLAY DEVICE

CROSS-REFERENCE TO RELATED APPLICATIONS

The present application claims the priority of Chinese Patent Application No. 201811114424.5, filed on Sep. 25, 2018, the contents of which are incorporated herein in their entirety by reference.

TECHNICAL FIELD

The present disclosure relates to the field of display technology, and particularly to a display substrate, a display device, and a method for manufacturing the display substrate.

BACKGROUND

A type of display substrates in the related art is to fabricate a light emitting layer (e.g., an organic light emitting layer) over a driving circuit layer (including a driving transistor) to cover an entire display substrate, each sub-pixel corresponds to a light emitting region of the light emitting layer, the driving transistor controls an anode corresponding to the light emitting region, anodes corresponding to light emitting regions of different sub-pixels are separated from each other, and adjacent sub-pixels are separated by a pixel defining layer.

SUMMARY

An embodiment of the present disclosure provides a display substrate, including a base substrate, a plurality of first electrodes disposed in an array and insulated from each other above the base substrate, and a light emitting layer disposed at a side of the first electrodes distal from the base substrate, the first electrodes being distributed in a first direction and a second direction which intersect with each other, the display substrate further includes a plurality of signal lines extending in the first direction and a plurality of fuse wires extending in the second direction, an orthographic projection of each of the signal lines on the base substrate is located between orthographic projections of the first electrodes, adjacent to each other in the second direction, on the base substrate, and an orthographic projection of each of the fuse wires on the base substrate is located between orthographic projections of the first electrodes, adjacent to each other in the first direction, on the base substrate, each of the fuse wires has a fusing point higher than that of the light emitting layer, the fuse wires are located at a side of the light emitting layer proximal to the base substrate and are in contact with the light emitting layer, each of the fuse wires is electrically coupled to at least two of the signal lines, and an orthographic projection of at least one of the first electrodes on the base substrate is located between orthographic projections of the at least two of the signal lines on the base substrate.

In some implementations, adjacent ones of the first electrodes are separated by a pixel defining layer.

In some implementations, each of the fuse wires is disposed in a through groove of the pixel defining layer, and the first electrodes and the fuse wires are disposed in a same layer.

In some implementations, the light emitting layer is disposed at a side of the first electrodes, the pixel defining layer and the fuse wires distal from the base substrate, and the light emitting layer is in contact with each of the fuse wires within the through groove.

In some implementations, the signal lines are disposed at a side of the fuse wires proximal to the base substrate.

In some implementations, at least one of the signal lines is a gate line, a gate insulating layer is disposed at a side of the signal lines distal from the base substrate, an auxiliary electrode block is disposed at a side of the gate insulating layer distal from the base substrate, the auxiliary electrode block is electrically coupled to the signal line corresponding thereto through a first via hole penetrating through the gate insulating layer, a passivation layer is disposed at a side of the auxiliary electrode block distal from the base substrate, the fuse wires are disposed at a side of the passivation layer distal from the base substrate, and the auxiliary electrode block is electrically coupled to the fuse wire corresponding thereto through a second via hole penetrating through the passivation layer.

In some implementations, the fuse wires are formed of a transparent conductive material.

In some implementations, each of the fuse wires is electrically coupled to only two of the signal lines adjacent to one of the first electrodes in the second direction.

In some implementations, the display substrate further includes a second electrode disposed at a side of the light emitting layer distal from the base substrate, each of the first electrodes, the light emitting layer in contact with said each of the first electrodes, and the second electrode in contact with the light emitting layer constitute a light emitting diode.

An embodiment of the present disclosure also provides a display device, which includes the display substrate described above.

In some implementations, the display device further includes a color filter substrate disposed opposite to the display substrate, light emitted by the display substrate passes through the color filter substrate to exit, and a color filter of a corresponding color is disposed at a position of the color filter substrate corresponding to each of the first electrodes.

In some implementations, color filters adjacent to each other in the second direction have a same color, and color filters adjacent to each other in the first direction have different colors.

An embodiment of the present disclosure also provides a method for manufacturing the display substrate described above, the method including: providing a base substrate; forming a plurality of signal lines extending in a first direction above the base substrate; forming a plurality of first electrodes which are distributed in an array and insulated from each other, the first electrodes are distributed in the first direction and a second direction which intersects with the first direction, and an orthographic projection of each of the signal lines on the base substrate is positioned between orthographic projections of the first electrodes, adjacent to each other in the second direction, on the base substrate; forming a plurality of fuse wires extending in the second direction and a light emitting layer, an orthographic projection of each of the fuse wires on the base substrate is positioned between orthographic projections of the first electrodes, adjacent to each other in the first direction, on the base substrate, each of the fuse wires has a fusing point higher than that of the light emitting layer, in contact with the light emitting layer, and electrically coupled to at least two of the signal lines, and an orthographic projection of at least one of the first electrodes on the base substrate is positioned between orthographic projections of the at least two of the signal lines on the base substrate; and applying different voltages to the at least two of the signal lines electrically coupled to said each of the fuse wires to generate a current in said each of the fuse wires, thereby burning out the light emitting layer in contact with said each of the fuse wires and then fusing out said each of the fuse wires itself.

In some implementations, the method further includes: forming a pixel defining layer, adjacent ones of the first electrodes are separated by the pixel defining layer.

In some implementations, the method further includes: forming a through groove in the pixel defining layer, each of the fuse wires is formed in the through groove of the pixel defining layer, and the first electrodes and the fuse wires are formed in a same layer by a single patterning process.

In some implementations, the light emitting layer is formed at a side of the first electrodes, the pixel defining layer and the fuse wires distal from the base substrate, and the light emitting layer is in contact with each of the fuse wires within the through groove.

In some implementations, the signal lines are formed at a side of the fuse wires proximal to the base substrate.

In some implementations, the method further includes: forming a gate insulating layer at a side of the signal lines distal from the base substrate; forming an auxiliary electrode block at a side of the gate insulating layer distal from the base substrate, the auxiliary electrode block is electrically coupled to the signal line corresponding thereto through a first via hole penetrating through the gate insulating layer; and forming a passivation layer at s side of the auxiliary electrode block distal from the base substrate, the fuse wires are formed at a side of the passivation layer distal from the base substrate, and the auxiliary electrode block is electrically coupled to the fuse wire corresponding thereto through a second via hole penetrating through the passivation layer.

In some implementations, each of the fuse wires is formed to be electrically coupled to only two of the signal lines adjacent to one of the first electrodes in the second direction.

In some implementations, the method further includes: forming a second electrode at a side of the light emitting layer distal from the base substrate, each of the first electrodes, the light emitting layer in contact with said each of the first electrodes and the second electrode in contact with the light emitting layer form a light emitting diode.

DESCRIPTION OF EMBODIMENTS

In order to make a person skilled in the art understand technical solutions of the present disclosure better, the present disclosure will be described in detail below in conjunction with accompanying drawings and specific embodiments.

In this disclosure, two structures being "arranged in a same layer" is in a sense that they are formed from a same material layer and thus are in a same layer in a stacked relationship, which does not represent that they are equidistant from the base substrate, nor that other layer structures between one of them and the base substrate are identical to those between the other one of them and the base substrate.

In the present disclosure, the "patterning process" refers to a step of forming a structure having a specific pattern, and may be a photolithography process including one or more of steps of forming a material layer, coating photoresist, exposing, developing, etching, stripping off photoresist, and the like. Certainly, the "patterning process" may also be any other process such as an imprint process, an inkjet printing process, or the like.

In the related art, the light emitting layer of a type of display substrates covers the entire display substrate, each sub-pixel corresponds to a light emitting region of the light emitting layer, and after a display panel is formed by combining the display substrate with a color filter substrate, a current path from an anode corresponding to the light emitting region of one sub-pixel to a cathode through the light emitting region of another adjacent sub-pixel exists, so that when the one sub-pixel emits light, a part of current flows into the another adjacent sub-pixel, and the light emitting region corresponding to the another adjacent sub-pixel also emits light, which causes a light leakage defect.

Figure 1:
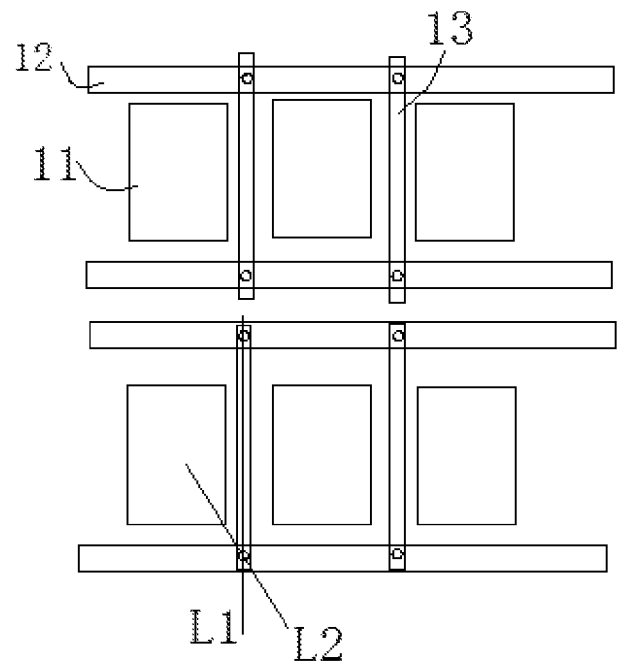
FIG. 1 is a top perspective view of a display substrate of an embodiment of the present disclosure.
Figure 2:
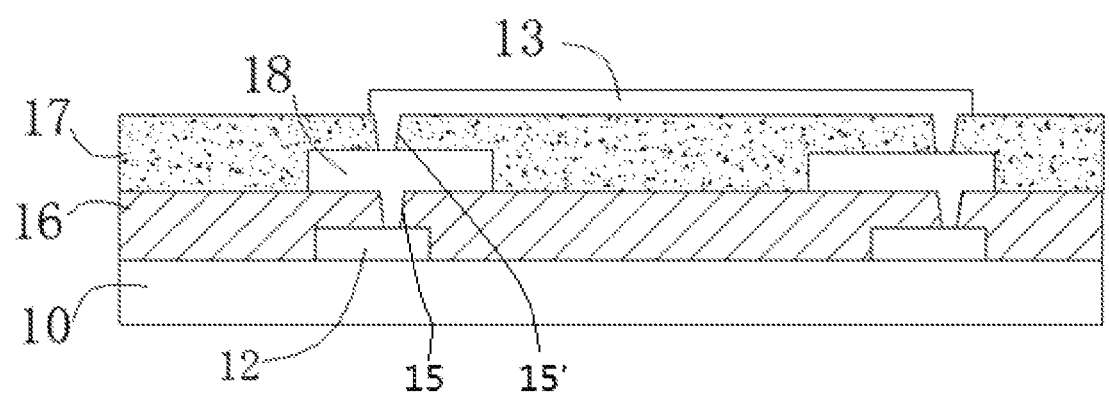
FIG. 2 is a cross-sectional view of the display substrate of FIG. 1 taken along line L1.
Figure 3:
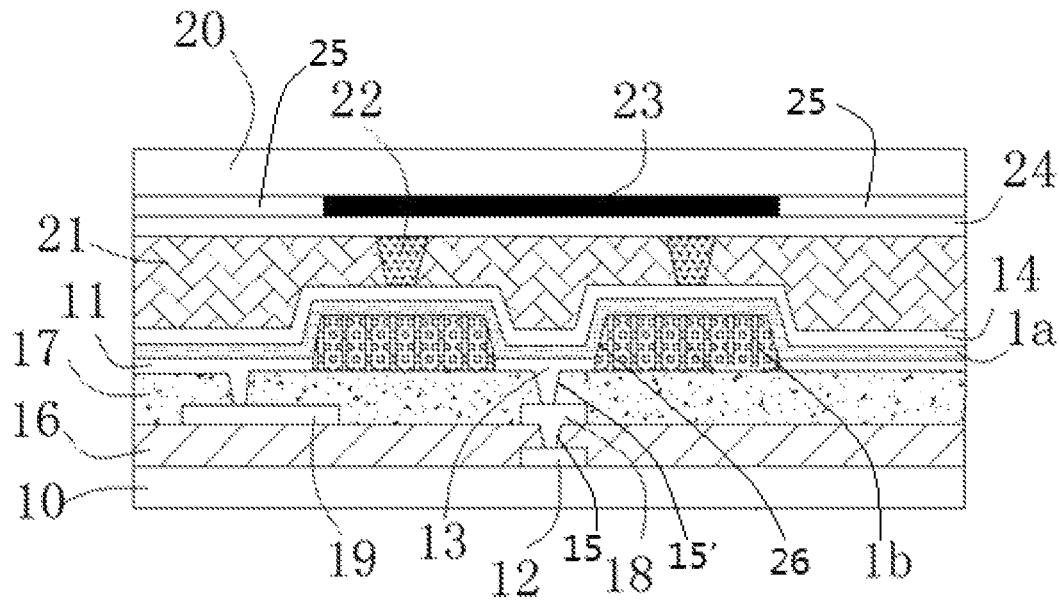
FIG. 3 is a cross-sectional view of a display panel including the display substrate shown in FIG. 1, taken along line L2 of FIG. 1.

An embodiment of the present disclosure provides a display substrate, as shown in FIGS. 1 through 3, the display substrate includes a base substrate 10, a plurality of first electrodes 11 disposed in an array and insulated from each other above the base substrate 10, the first electrodes 11 are distributed in a first direction and a second direction which intersect with each other, the display substrate further includes a light emitting layer (e.g. an organic light emitting layer) 1a disposed at a side of the first electrodes 11 distal from the base substrate 10, the display substrate further includes a plurality of signal lines 12 extending in the first direction (e.g., row direction) and a plurality of fuse wires 13 extending in the second direction (e.g., column direction), an orthographic projection of each of the signal lines 12 on the base substrate 10 is located between orthographic projections of the first electrodes 11, adjacent to each other in the second direction, on the base substrate 10, an orthographic projection of each of the fuse wires 13 on the base substrate 10 is located between orthographic projections of the first electrodes 11, adjacent to each other in the first direction, on the base substrate 10, each of the fuse wires 13 has a fusing point higher than that of the light emitting layer 1a, the fuse wires 13 are located at a side of the light emitting layer 1a proximal to the base substrate 10 and are in contact with the light emitting layer 1a, each of the fuse wires 13 is electrically coupled to at least two of the signal lines 12, and an orthographic projection of at least one of the first electrodes 11 on the base substrate 10 is located between orthographic projections of the at least two of the signal lines 12 on the base substrate 10.

In some implementations, the display substrate of the embodiment further includes a second electrode 14 disposed at a side of the light emitting layer 1a distal from the base substrate 10.

In the embodiment, each of the first electrodes 11, the light emitting layer 1a in contact with said each of the first electrodes 11, and the second electrode 14 in contact with the light emitting layer 1a constitute a light emitting diode, such as an Organic Light Emitting Diode (OLED), in such case, the display substrate of the embodiment is an OLED display substrate.

For example, each of the first electrodes 11 may be an anode of the light emitting diode, and the second electrode 14 may be a cathode of the light emitting diode.

In the embodiment, each of the first electrodes 11 corresponds to one sub-pixel, and may be independently applied with a driving voltage by a driving circuit. The second electrode 14 may be an entire structure corresponding to a plurality of sub-pixels, and is uniformly applied with a common voltage. Certainly, the second electrode 14 may include a plurality of blocks, each of which may correspond to one sub-pixel, and a same common voltage is applied to the blocks. In this way, a voltage difference is generated between the first electrode 11 and the second electrode 14 which correspond to each other, and a conductive path from the first electrode 11 to the second electrode 14 through the light emitting layer 1a is formed, so that the light emitting region of the light emitting layer 1a between the first electrode 11 and the second electrode 14 emits light (a light emitting brightness is determined by the voltage of the first electrode 11).

In a color filter substrate to be combined with the display substrate of the embodiment, color filters 25 of different colors are disposed at positions corresponding to different color sub-pixels (respectively corresponding to the first electrodes 11 in the display substrate), so that one sub-pixel is formed at the position of each of the first electrodes 11 after the display substrate and the color filter substrate are aligned and combined.

As shown in FIG. 1, one fuse wire 13 is formed between the first electrodes 11 adjacent to each other in the first direction. An end of the fuse wire 13 is coupled to one of two signal lines 12, the other end of the fuse wire 13 is coupled to the other one of the two signal lines 12, and one first electrode 11 is provided between the two signal lines 12. For example, a current may be formed in the fuse wire 13 by applying a voltage difference across the two signal lines 12.

The fuse wire 13 is in contact with the light emitting layer 1a, and the fuse wire 13 has a fusing point higher than that of the light emitting layer 1a, and when the fuse wire 13 generates heat due to the current flowing through, the fuse wire 13 burns out the light emitting layer 1a in contact with the fuse wire 13, so that a connection between light emitting regions of the light emitting layer 1a corresponding to the first electrodes 11 adjacent to each other in the first direction is cut off, and thus, in subsequent applications, there is no current path from the first electrode 11 corresponding to the light emitting region of one sub-pixel to the second electrode 14 through the light emitting region of another adjacent sub-pixel, therefore the light leakage defect in the related art described above is avoided.

It should be understood that, although FIG. 1 shows that each of the signal lines 12 extends in the row direction and each of the fuse wires 13 extends in the column direction, in fact, each of the signal lines 12 may extend in the column direction and each of the fuse wires 13 may extend in the row direction, alternatively, each of the signal lines 12 may include a portion extending in the row direction and a portion extending in the column direction and each of the fuse wires 13 may include a portion extending in the row direction and a portion extending in the column direction.

In the embodiment, a size of a cross section of the fuse wire 13 perpendicular to an extending direction thereof may be designed to be as small as possible so that the fuse wire 13 has a sufficient large resistance, and thus, sufficient heat may be generated by the fuse wire 13 without significant heat generation of the signal lines 12 so as to cut off the connection between the light emitting regions of the light emitting layer 1a. For example, a shape of the cross section of the fuse wire 13 perpendicular to the extending direction thereof may be a rectangle, and sizes of two adjacent sides of the rectangle may be about 4 μm to 8 μm and about 500 angstroms to 1000 angstroms, respectively, specifically, for example, the size of one of the two adjacent sides of the rectangle may be 5 μm or 6 μm, and the size of the other one of the two adjacent sides of the rectangle may be 600 angstroms or 700 angstroms, which may result in a good fusing effect of the fuse wire 13.

Since the fusing point of the fuse wire 13 is higher than that of the light emitting layer 1a, the fuse wire 13 is fused itself due to heat generation only after the light emitting layer 1a is cut off. The fuse wire 13 being fused means that the connection between the two signal lines 12 coupled to the fuse wire 13 is cut off, thus the two signal lines 12 are independent of each other in the subsequent applications.

The pixel defining layer 1b is usually in contact with the fuse wire 13, but since the pixel defining layer 1b does not function to transmit current, even if a portion of the pixel defining layer 1b in contact with the fuse wire 13 is slightly burned out, normal operations of functional structures in the display substrate will not be affected.

Certainly, in some implementations, the fusing point of the fuse wire 13 may be lower than that of other structures (except the light emitting layer 1a) in contact therewith, which may further ensure normal operations of structures in the display substrate.

In some implementations, the display substrate includes a gate line extending in the first direction.

In general, the display substrate includes gate lines and data lines extending in different directions, for example, each of the gate lines may extend in the first direction (e.g., row direction) and each of the data lines may extend in the second direction (e.g., column direction). Certainly, as needed, each of the gate lines may extend in the second direction and each of the data lines may extend in the first direction.

In some implementations, as shown in FIG. 3, the first electrodes 11 adjacent to each other are separated by the pixel defining layer 1b, so that current flowing from the first electrode 11 corresponding to the light emitting region of one sub-pixel to the second electrode 14 through the light emitting region of another sub-pixel can be better prevented. Certainly, other types of insulating structures may be provided between the first electrodes 11 adjacent to each other. The first electrodes 11 may be formed prior to the pixel defining layer 1b or may be formed after the pixel defining layer 1b is formed.

In some implementations, as shown in FIG. 3, the pixel defining layer 1b is provided with a through groove 26 at a position corresponding to the fuse wire 13, the fuse wire 13 is disposed in the through groove 26, for example, the fuse wire 13 may be disposed in the same layer as the first electrode 11, and the light emitting layer 1a is in contact with the fuse wire 13 in the through groove 26. In the embodiment, the fuse wire 13 may be formed prior to the pixel defining layer 1b or after the pixel defining layer 1b is formed. Certainly, the pixel defining layer 1b may not be provided with the through groove 26 therein, the fuse wire 13 may be disposed on an upper surface of the pixel defining layer 1b, the signal line 12 may be disposed below the pixel defining layer 1b, and then the fuse wire 13 may be coupled to the signal line 12 through a via hole penetrating through the pixel defining layer 1b.

In some implementations, at least one of the signal lines 12 is a gate line. That is, the gate line conventionally provided in the display substrate may also be used as the aforementioned signal line 12. For the OLED display substrate, since a row of first electrodes 11 generally correspond to two gate lines, thus the gate lines may also be used as the signal lines 12, thereby there is no need to provide special signal lines 12 for eliminating light leakage defect.

In some implementations, as shown in FIGS. 2 and 3, a gate insulating layer 16 is disposed at a side of the signal lines (e.g., gate lines) 12 distal from the base substrate 10, an auxiliary electrode block 18 is disposed at a side of the gate insulating layer 16 distal from the base substrate 10, the auxiliary electrode block 18 is coupled to the signal line 12 corresponding thereto through a first via hole 15 penetrating through the gate insulating layer 16, a passivation layer 17 is disposed at a side of the auxiliary electrode block 18 distal from the base substrate 10, and the auxiliary electrode block 18 is coupled to the fuse wire 13 corresponding thereto through a second via hole 15' penetrating through the passivation layer 17.

A plurality of insulating material layers (e.g., the passivation layer 17 and the gate insulating layer 16) are penetrated through for coupling the fuse wire 13 to the signal line 12 (e.g., gate line), the auxiliary electrode block 18 is provided so that, when the display substrate is manufactured, via holes are formed in different insulating material layers respectively, and each of the via holes only needs to penetrate through one of the insulating material layers, which is easy to implement in terms of process. The auxiliary electrode block 18 also can reduce a resistance of a connection structure between the fuse wire 13 and the signal line 12, thus reduce heat generation of the connection structure.

In some implementations, the fuse wires 13 may be formed of a transparent conductive material. Generally, the transparent conductive material may be an oxide conductive material, which has a fusing point and a resistance heating performance conforming to requirements of solutions in embodiments of the present disclosure. In some implementations, the fuse wires 13 may be formed of an Indium Tin Oxide (ITO) material.

In some implementations, the fuse wires 13 and the first electrodes 11 are formed in a same layer by a single patterning process, so that the number of masks is not increased.

In some implementations, each of the fuse wires 13 may be electrically coupled to only two signal lines 12 on both sides of one of the first electrodes 11 in the second direction. In such way, as shown in FIG. 1, the fusing of the light emitting layer 1a between the first electrodes 11 of each row is independent of the fusing of the light emitting layer 1a between the first electrodes 11 of another row. Certainly, one fuse wire 13 may be coupled to two signal lines 12 between which a plurality of rows of first electrodes 11 are disposed. Alternatively, one fuse wire 13 may be coupled to three, four, or more signal lines 12, and the current flowing through the fuse wire 13 is controlled by controlling voltages applied to the signal lines 12 to eliminate the light leakage defect.

As shown in FIG. 3, the display substrate of the embodiment may further include an output electrode 19, which may be disposed in the same layer as the auxiliary electrode block 18 and may be electrically coupled to the first electrode 11 corresponding thereto through a via hole disposed in the passivation layer 17. In addition, the output electrode 19 may be coupled to a driving circuit (e.g., a drain of a driving transistor) within the display substrate, thereby supplying a driving voltage from the driving circuit to the first electrode 11.

An embodiment of the present disclosure also provides a display device including the display substrate provided by the embodiment of the present disclosure.

In some implementations, as shown in FIG. 3, the display device of the embodiment further includes a color filter substrate disposed opposite to the display substrate, light emitted by the display substrate passes through the color filter substrate to exit, and a color filter 25 of a corresponding color is disposed at a position of the color filter substrate corresponding to each of the first electrodes 11.

As shown in FIG. 3, the color filter substrate may include a cover plate 20, a black matrix 23 and color filters 25 disposed at a side of the cover plate 20 proximal to the display substrate, and an Over Coater (OC) 24 disposed at a side of the black matrix 23 and the color filters 25 proximal to the display substrate. A filler (e.g., liquid crystal) 21 and support pillars 22 disposed in the filler 21 may be provided between the display substrate and the color filter substrate.

In the embodiment, the color filter substrate may be a color filter substrate of a conventional design.

As an example, an orthographic projection of the pixel defining layer 1b on the base substrate 10 may overlap with an orthographic projection of the black matrix 23 on the base substrate 10, and an orthographic projection of each of the first electrodes 11 on the base substrate 10 may at least partially overlap with an orthographic projection of the color filter 25, corresponding to said each of the first electrodes 11, on the base substrate 10.

In some implementations, colors of the color filters 25 adjacent to each other in the second direction may be the same with each other, and colors of the color filters 25 adjacent to each other in the first direction may be different from each other. That is, for the display substrate shown in FIG. 1, the colors of the color filters 25 corresponding to the first electrodes 11 adjacent to each other in the same column may be the same with each other, and the colors of the color filters 25 corresponding to the first electrodes 11 adjacent to each other in the same row may be different from each other. As shown in FIG. 1, even if light leakage occurs between adjacent sub-pixels in a same column, an influence on display is small compared to the case where light leakage occurs between adjacent sub-pixels in a same row. In this way, if the wiring space of the display substrate is limited and only the fuse wires 13 extending in the second direction can be arranged as shown in FIG. 1 to avoid light leakage between the adjacent sub-pixels in the first direction, the influence of light leakage between the adjacent sub-pixels in the second direction on display is small.

Alternatively, the colors of the color filters 25 adjacent to each other in the first direction may be the same with each other, and the colors of the color filters 25 adjacent to each other in the second direction may be different from each other. That is, for the display substrate shown in FIG. 1, the colors of the color filters 25 corresponding to the first electrodes 11 adjacent to each other in the same row may be the same with each other, and the colors of the color filters 25 corresponding to the first electrodes 11 adjacent to each other in the same column may be different from each other. In this way, as shown in FIG. 1, even if light leakage occurs between adjacent sub-pixels in the same row, the influence on display is small compared to the case where light leakage occurs between adjacent sub-pixels in the same column.

Thus, if the wiring space of the display substrate is limited and only the fuse wires 13 extending in the first direction can be arranged to avoid light leakage between the adjacent sub-pixels in the second direction, the influence of the light leakage between the adjacent sub-pixels in the first direction on the display is small.

In the embodiment, the display device may be any product or component with a display function, such as an Organic Light Emitting Diode (OLED) display panel, an electronic paper, a mobile phone, a tablet computer, a television, a display, a notebook computer, a digital photo frame, and a navigator.

Figure 4:
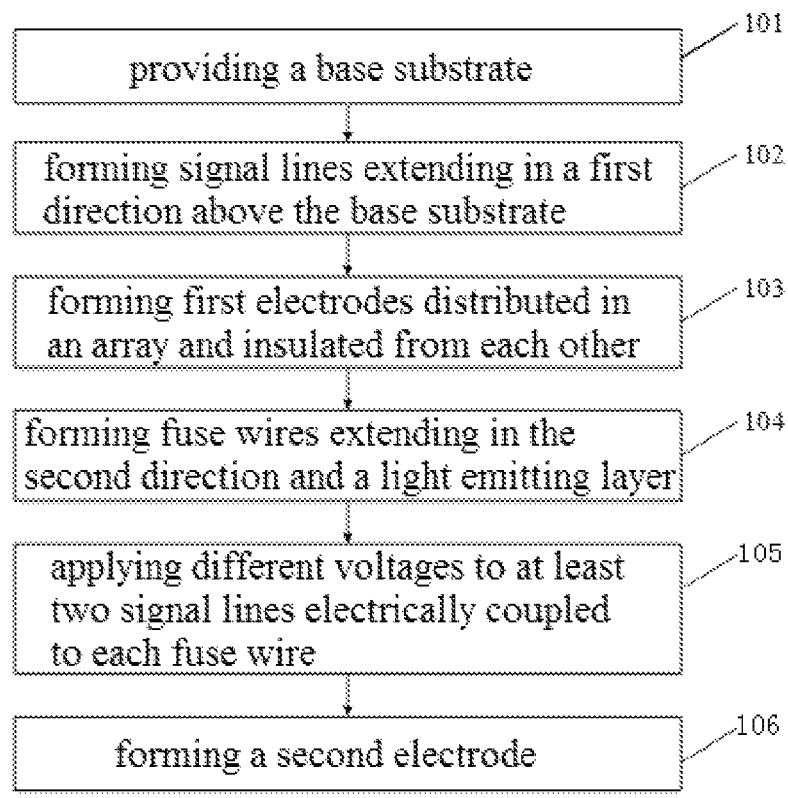
FIG. 4 is a flowchart of a method for manufacturing a display substrate according to an embodiment of the disclosure.

An embodiment of the present disclosure also provides a method for manufacturing a display substrate, as shown in FIG. 4, the method may include following steps 101 through 105.

Step 101, providing a base substrate.

Step 102, forming a plurality of signal lines extending in a first direction above the base substrate.

Step 103, forming a plurality of first electrodes distributed in an array and insulated from each other, the first electrodes are distributed in a first direction and a second direction which intersect with each other, and an orthographic projection of each of the signal lines on the base substrate is located between orthographic projections of the first electrodes adjacent to each other in the second direction, on the base substrate.

Step 104, forming a plurality of fuse wires extending in the second direction and a light emitting layer, an orthographic projection of each of the fuse wires on the base substrate is located between orthographic projections of the first electrodes adjacent to each other in the first direction on the base substrate, each of the fuse wires has a fusing point higher than that of the light emitting layer and is in contact with the light emitting layer, each of the fuse wires is electrically coupled to at least two of the signal lines, and an orthographic projection of at least one of the first electrodes on the base substrate is located between orthographic projections of the at least two of the signal lines on the base substrate.

Step 105, applying different voltages to the at least two of the signal lines electrically coupled to each of the fuse wires to generate a current in said each of the fuse wires, thereby burning out the light emitting layer in contact with said each of the fuse wires and then fusing out said each of the fuse wires itself.

In the embodiment, the first direction may be a row direction and the second direction may be a column direction. Alternatively, the first direction may be the column direction and the second direction may be the row direction.

In some implementations, the method of the embodiment may further include: Step 106, forming a second electrode, and each of the first electrodes, the light emitting layer in contact with said each of the first electrodes, and the second electrode in contact with the light emitting layer form a light emitting diode.

In the embodiment, the signal line may be a gate line, and the gate line is generally driven by cascaded shift registers, and by controlling a clock period, the fuse wire may have sufficient time to burn out the light emitting layer in contact with the fuse wire and then fuse out itself, but the disclosure is not limited thereto.

Figure 5:
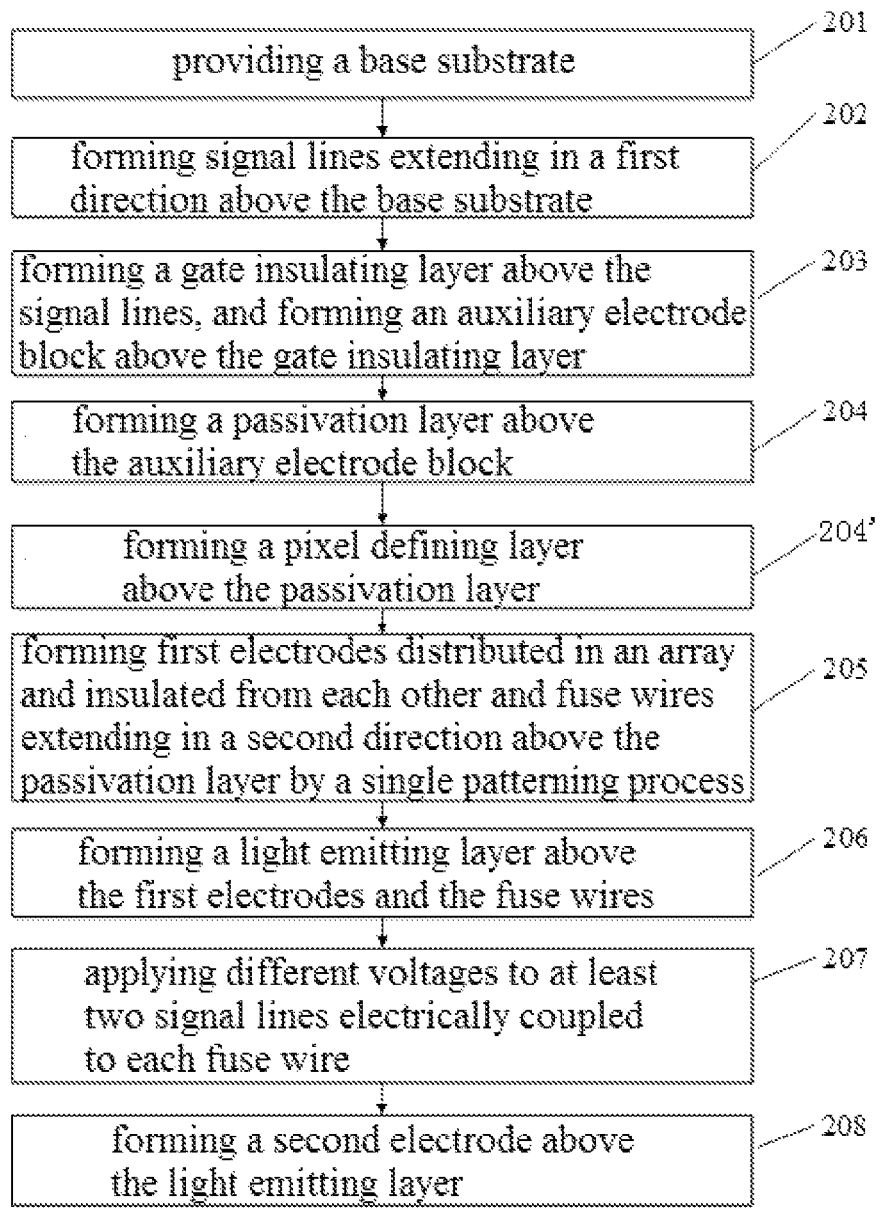
FIG. 5 is another flowchart of a method for manufacturing a display substrate according to an embodiment of the disclosure.

As shown in FIG. 5, the method of the embodiment may further include following steps 201 through 207.

Step 201, providing a base substrate.

Step 202, forming a plurality of signal lines extending in a first direction above the base substrate.

Step 203, forming a gate insulating layer above the signal lines, and forming an auxiliary electrode block above the gate insulating layer, the auxiliary electrode block is electrically coupled to the signal line corresponding thereto through a first via hole penetrating through the gate insulating layer.

And 204, forming a passivation layer above the auxiliary electrode block.

Step 205, forming a plurality of first electrodes distributed in an array and insulated from each other and a plurality of fuse wires extending in a second direction above the passivation layer by a single patterning process, the auxiliary electrode block is electrically coupled to the fuse wire corresponding thereto through a second via hole penetrating through the passivation layer, the first electrodes are distributed in the first direction and the second direction which intersect with each other, an orthographic projection of each of the signal lines on the base substrate is located between orthographic projections of the first electrodes adjacent to each other in the second direction on the base substrate, an orthographic projection of each of the fuse wires on the base substrate is located between orthographic projections of the first electrodes adjacent to each other in the first direction on the base substrate, each of the fuse wires is electrically coupled to at least two of the signal lines, and an orthographic projection of at least one of the first electrodes on the base substrate is located between orthographic projections of the at least two of the signal wires on the base substrate.

Step 206, forming a light emitting layer above the first electrodes and the fuse wires, wherein each of the fuse wires is in contact with the light emitting layer, and each of the fuse wires has a fusing point higher than that of the light emitting layer.

Step 207, applying different voltages to the at least two of the signal lines electrically coupled to each of the fuse wires to generate a current in said each of the fuse wires, thereby burning out the light emitting layer in contact with said each of the fuse wires and then fusing out each of the fuse wires itself.

In the embodiment, the first direction may be a row direction and the second direction may be a column direction. Alternatively, the first direction may be the column direction and the second direction may be the row direction.

In some implementations, the method of the embodiment may further include: Step 204', forming a pixel defining layer above the passivation layer, adjacent ones of the first electrodes are separated by the pixel defining layer, and each of the fuse wires is formed in a through groove of the pixel defining layer.

In some implementations, the method of embodiment may further include: Step 208, forming a second electrode above the light emitting layer, each of the first electrodes, the light emitting layer in contact with said each of the first electrodes, and the second electrode in contact with the light emitting layer constitute a light emitting diode.

It should be noted that, the steps of the method for manufacturing the display substrate of the embodiment of the present disclosure may be performed out of the order described above without departing from the principle of the present disclosure.

Furthermore, features of various embodiments of the disclosure may be combined arbitrarily, without conflict.

It should be understood that, the above embodiments and implementations are merely exemplary embodiments and implementations for explaining principle of the present disclosure, but the present disclosure is not limited thereto. Various modifications and variants may be made by those ordinary skilled in the art within the spirit and essence of the present disclosure, these modifications and variants fall into the protection scope of the present disclosure.

The invention claimed is:

1. A display substrate for avoiding light leakage defect, comprising:
   a base substrate;
   a plurality of first electrodes disposed in an array and insulated from each other above the base substrate;
   a light emitting layer disposed at a side of the first electrodes distal from the base substrate, the first electrodes being distributed in a first direction and a second direction which intersect with each other;
   a plurality of signal lines extending in the first direction; and
   a plurality of fuse wires extending in the second direction, wherein
   an orthographic projection of each of the signal lines on the base substrate is located between orthographic projections of the first electrodes, adjacent to each other in the second direction, on the base substrate;
   an orthographic projection of each of the fuse wires on the base substrate is located between orthographic projections of the first electrodes, adjacent to each other in the first direction, on the base substrate;
   each of the fuse wires has a fusing point higher than that of the light emitting layer;
   the fuse wires are located at a side of the light emitting layer proximal to the base substrate and are in contact with the light emitting layer, each of the fuse wires is electrically coupled to at least two of the signal lines, and an orthographic projection of at least one of the first electrodes on the base substrate is located between orthographic projections of the at least two of the signal lines on the base substrate.

2. The display substrate of claim 1, wherein adjacent ones of the first electrodes are separated by a pixel defining layer.

3. The display substrate of claim 2, wherein each of the fuse wires is disposed in a through groove of the pixel defining layer, and the first electrodes and the fuse wires are disposed in a same layer.

4. The display substrate of claim 3, wherein the light emitting layer is disposed at a side of the first electrodes, the pixel defining layer and the fuse wires distal from the base substrate, and the light emitting layer is in contact with each of the fuse wires within the through groove.

5. The display substrate of claim 4, wherein the signal lines are disposed at a side of the fuse wires proximal to the base substrate.

6. The display substrate of claim 1, wherein at least one of the signal lines is a gate line, and a gate insulating layer is disposed at a side of the signal lines distal from the base substrate.

7. The display substrate of claim 1, wherein the fuse wires are formed of a transparent conductive material.

8. The display substrate of claim 1, wherein each of the fuse wires is electrically coupled to only two of the signal lines adjacent to one of the first electrodes in the second direction.

9. The display substrate of claim 1, further comprising a second electrode disposed at a side of the light emitting layer distal from the base substrate, each of the first electrodes, the light emitting layer in contact with said each of the first electrodes, and the second electrode in contact with the light emitting layer constitute a light emitting diode.

10. A display device, comprising the display substrate of claim 1.

11. The display device of claim 10, further comprising a color filter substrate disposed opposite to the display substrate, light emitted by the display substrate passes through the color filter substrate to exit, and a color filter of a corresponding color is disposed at a position of the color filter substrate corresponding to each of the first electrodes.

12. The display device of claim 11, wherein color filters adjacent to each other in the second direction have a same color, and color filters adjacent to each other in the first direction have different colors.

13. A method for manufacturing the display substrate of claim 1, the method comprising:
   providing a base substrate;
   forming a plurality of signal lines extending in a first direction above the base substrate; and
   forming a plurality of first electrodes which are distributed in an array and insulated from each other, the first electrodes are distributed in the first direction and a second direction which intersects with the first direction, and an orthographic projection of each of the signal lines on the base substrate is positioned between orthographic projections of the first electrodes, adjacent to each other in the second direction, on the base substrate, wherein
   the method further comprises:
   forming a plurality of fuse wires extending in the second direction and a light emitting layer, an orthographic projection of each of the fuse wires on the base substrate is positioned between orthographic projections of the first electrodes, adjacent to each other in the first direction, on the base substrate, each of the fuse wires has a fusing point higher than that of the light emitting layer, in contact with the light emitting layer, and electrically coupled to at least two of the signal lines, and an orthographic projection of at least one of the first electrodes on the base substrate is positioned between orthographic projections of the at least two of the signal lines on the base substrate; and
   applying different voltages to the at least two of the signal lines electrically coupled to said each of the fuse wires to generate a current in said each of the fuse wires, thereby burning out the light emitting layer in contact with said each of the fuse wires and then fusing out said each of the fuse wires itself.

14. The method of claim 13, further comprising:
   forming a pixel defining layer, adjacent ones of the first electrodes are separated by the pixel defining layer; and
   forming a through groove in the pixel defining layer, each of the fuse wires is formed in the through groove of the pixel defining layer, and the first electrodes and the fuse wires are formed in a same layer by a single patterning process,
   wherein the light emitting layer is formed at a side of the first electrodes, the pixel defining layer and the fuse wires distal from the base substrate, and the light emitting layer is in contact with each of the fuse wires within the through groove, and
   the signal lines are formed at a side of the fuse wires proximal to the base substrate.

15. The method of claim 13, further comprising:
   forming a gate insulating layer at a side of the signal lines distal from the base substrate;
   forming an auxiliary electrode block at a side of the gate insulating layer distal from the base substrate, the auxiliary electrode block is electrically coupled to the signal line corresponding thereto through a first via hole penetrating through the gate insulating layer; and forming a passivation layer at s side of the auxiliary electrode block distal from the base substrate, the fuse wires are formed at a side of the passivation layer distal from the base substrate, and the auxiliary electrode block is electrically coupled to the fuse wire corresponding thereto through a second via hole penetrating through the passivation layer.

16. The method of claim 13, wherein each of the fuse wires is formed to be electrically coupled to only two of the signal lines adjacent to one of the first electrodes in the second direction.

17. The method of claim 13, further comprising:
forming a second electrode at a side of the light emitting layer distal from the base substrate, each of the first electrodes, the light emitting layer in contact with said each of the first electrodes and the second electrode in contact with the light emitting layer form a light emitting diode.

18. The display substrate of claim 1, wherein light emitting regions, corresponding to the first electrodes adjacent to each other in the first direction, of the light emitting layer in contact with the fuse wires are disconnected under control of a current in the fuse wires.

19. The display substrate of claim 18, wherein the fuse wires are fused so that the signal lines coupled thereto are disconnected after the light emitting regions of the light emitting layer are disconnected.

20. The display substrate of claim 6, wherein an auxiliary electrode block is disposed at a side of the gate insulating layer distal from the base substrate, the auxiliary electrode block is electrically coupled to the signal line corresponding thereto through a first via hole penetrating through the gate insulating layer, a passivation layer is disposed at a side of the auxiliary electrode block distal from the base substrate, the fuse wires are disposed at a side of the passivation layer distal from the base substrate, and the auxiliary electrode block is electrically coupled to the fuse wire corresponding thereto through a second via hole penetrating through the passivation layer.

* * * * *